United States Patent
Doyle et al.

(10) Patent No.: US 10,340,443 B2
(45) Date of Patent: Jul. 2, 2019

(54) PERPENDICULAR MAGNETIC MEMORY WITH FILAMENT CONDUCTION PATH

(71) Applicant: Intel Corporation, Santa Clara, CA (US)

(72) Inventors: Brian S. Doyle, Portland, OR (US);
Kaan Oguz, Beaverton, OR (US);
Kevin P. O'Brien, Portland, OR (US);
David L. Kencke, Beaverton, OR (US);
Elijah V. Karpov, Portland, OR (US);
Charles C. Kuo, Hillsboro, OR (US);
Mark L. Doczy, Portland, OR (US);
Satyarth Suri, Portland, OR (US);
Robert S. Chau, Beaverton, OR (US);
Niloy Mukherjee, Portland, OR (US);
Prashant Majhi, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/735,613

(22) PCT Filed: Jun. 26, 2015

(86) PCT No.: PCT/US2015/037898
§ 371 (c)(1),
(2) Date: Jan. 8, 2018

(87) PCT Pub. No.: WO2016/209249
PCT Pub. Date: Dec. 29, 2016

(65) Prior Publication Data
US 2018/0323367 A1 Nov. 8, 2018

(51) Int. Cl.
*H01L 43/02* (2006.01)
*H01L 43/08* (2006.01)
(Continued)

(52) U.S. Cl.
CPC ............ *H01L 43/02* (2013.01); *H01L 27/228* (2013.01); *H01L 43/08* (2013.01); *H01L 43/10* (2013.01);
(Continued)

(58) Field of Classification Search
CPC ... H01L 45/08; H01L 45/146; H01L 45/1533; H01L 45/1233; H01L 43/02; H01L 43/10; H01L 27/228
See application file for complete search history.

(56) References Cited

U.S. PATENT DOCUMENTS

| | | |
|---|---|---|
| 2003/0190770 A1 | 10/2003 | Yeom et al. |
| 2004/0127054 A1 | 7/2004 | Lee et al. |

(Continued)

FOREIGN PATENT DOCUMENTS

| | | |
|---|---|---|
| FR | 2998704 A1 | 5/2014 |
| JP | 2003298150 A | 10/2003 |

(Continued)

OTHER PUBLICATIONS

The International Searching Authority, "Written Opinion of the International Searching Authority and the International Search Report" dated Mar. 25, 2016 in International Application No. PCT/US2015/037898.

(Continued)

*Primary Examiner* — Yosef Gebreyesus
(74) *Attorney, Agent, or Firm* — Trop, Pruner & Hu, P.C.

(57) ABSTRACT

An embodiment includes an apparatus comprising: first and second electrodes on a substrate; a perpendicular magnetic tunnel junction (pMTJ), between the first and second electrodes, comprising a dielectric layer between a fixed layer and a free layer; and an additional dielectric layer directly contacting first and second metal layers; wherein (a) the first metal layer includes an active metal and the second metal
(Continued)

includes an inert metal, and (b) the second metal layer directly contacts the free layer. Other embodiments are described herein.

26 Claims, 4 Drawing Sheets

(51) Int. Cl.
    *H01L 45/00*     (2006.01)
    *H01L 27/22*     (2006.01)
    *H01L 43/10*     (2006.01)

(52) U.S. Cl.
    CPC ............ *H01L 45/08* (2013.01); *H01L 45/085* (2013.01); *H01L 45/1233* (2013.01); *H01L 45/1253* (2013.01); *H01L 45/145* (2013.01); *H01L 45/146* (2013.01)

(56) References Cited

U.S. PATENT DOCUMENTS

| | | | |
|---|---|---|---|
| 2004/0160818 | A1 | 8/2004 | Rinerson et al. |
| 2004/0165425 | A1 | 8/2004 | Nakamura et al. |
| 2007/0063237 | A1 | 3/2007 | Huai et al. |
| 2007/0132049 | A1* | 6/2007 | Stipe .................. G11C 13/0007 257/421 |
| 2009/0108888 | A1 | 4/2009 | Gebara et al. |
| 2009/0141543 | A1 | 6/2009 | Ho et al. |
| 2009/0159562 | A1 | 7/2009 | Cho et al. |
| 2011/0189796 | A1 | 8/2011 | Lu et al. |
| 2012/0028373 | A1 | 2/2012 | Belen et al. |
| 2012/0243291 | A1 | 9/2012 | Gopalakrishnan |
| 2013/0034917 | A1 | 2/2013 | Lee |
| 2013/0201757 | A1 | 8/2013 | Li et al. |
| 2014/0015078 | A1 | 1/2014 | Huai et al. |
| 2014/0103471 | A1* | 4/2014 | Lupino .................. H01L 27/224 257/421 |
| 2014/0167191 | A1 | 6/2014 | Doyle et al. |
| 2014/0284734 | A1* | 9/2014 | Kanaya .................. H01L 43/02 257/421 |
| 2015/0188033 | A1 | 7/2015 | Lamborn et al. |

FOREIGN PATENT DOCUMENTS

| | | |
|---|---|---|
| KR | 20080070812 A | 7/2008 |
| KR | 20100076557 A | 7/2010 |

OTHER PUBLICATIONS

U.S. Appl. No. 14/140,758, filed Dec. 26, 2013, and entitled "Methods of Forming a Magnetic Random Access Memory Etch Spacer and Structures Formed Thereby," by Daniel R. Lamborn et al.
Wikipedia, "Programmable read-only memory," https://en.wikipedia.org/wiki/Programmable_read-only_memory, accessed Jun. 22, 2015, 3 pages.
Wikipedia, "Resistive random-access memory," https://en.wikipedia.org/wiki/Resistive_random-access_memory, accessed Jun. 6, 2015, 6 pages.
International Application No. PCT/US2014/065984, filed Nov. 17, 2014 and titled "Methods of Forming a Magnetic Random Access Memory Etch Spacer and Structures Formed Thereby," by Daniel R. Lamborn et al.
European Patent Office, Extended European Search Report dated Jan. 21, 2019 for European Patent Application No. 15896536.8, 11 pages.

* cited by examiner

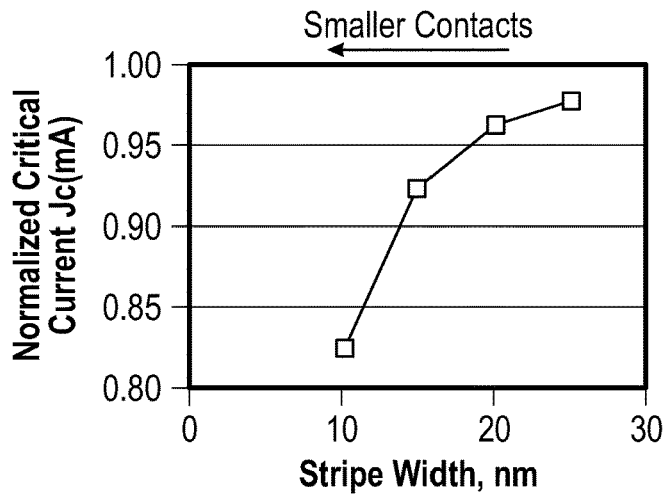
FIG. 1A
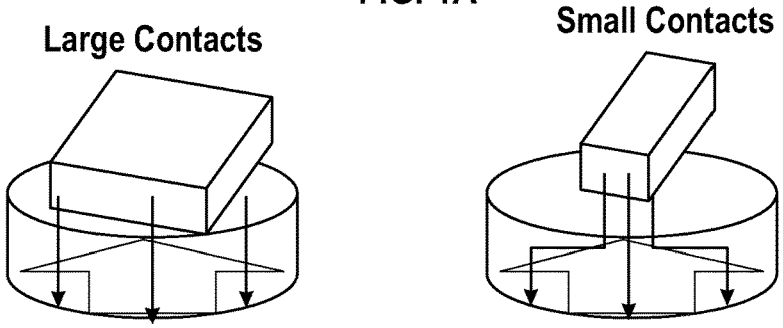
FIG. 1B
FIG. 1C
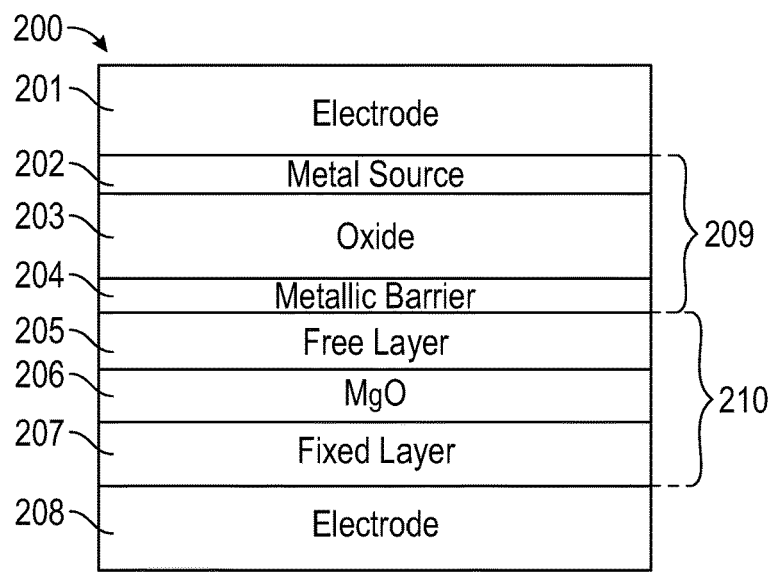
FIG. 2A

PERPENDICULAR MAGNETIC MEMORY WITH FILAMENT CONDUCTION PATH

TECHNICAL FIELD

Embodiments of the invention are in the field of semiconductor devices and, in particular, magnetic memory.

BACKGROUND

As described in U.S. Patent Application Publication 2015/0091110, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The operation of spin torque devices is based on the phenomenon of spin transfer torque (STT). If a current is passed through a magnetization layer, called the fixed magnetic layer, the current output from the magnetization layer will be spin polarized. With the passing of each electron, its spin (angular momentum) will be transferred to the magnetization in the next magnetic layer, called the free magnetic layer, and will cause a small change on its magnetization. This is, in effect, a torque-causing precession of magnetization. Due to reflection of electrons, a torque is also exerted on the magnetization of an associated fixed magnetic layer. In the end, if the current exceeds a certain critical value (which is a function of damping caused by the magnetic material and its environment), the magnetization of the free magnetic layer will be switched by a pulse of current, typically in about 1-10 nanoseconds. Magnetization of the fixed magnetic layer may remain unchanged since an associated current is below its threshold due to geometry or due to an adjacent anti-ferromagnetic layer.

Spin-transfer torque can be used to flip the active elements in magnetic random access memory. Spin-transfer torque memory (STTM) has the advantages of lower power consumption and better scalability over conventional magnetic random access memory (MRAM) which uses magnetic fields to flip the active elements.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

FIG. 1A is a graph illustrating the current (normalized current) needed to switch the magnetic direction in a free layer of an MTJ device vs. the contact size. FIG. 1B is a perspective view showing a first contact strip engaging the free layer in an MTJ device. FIG. 1C is a perspective view showing a contact smaller than the contact of FIG. 1B engaging the free layer in an MTJ device.

FIGS. 2A-B include MTJ stacks in embodiments of the invention.

DETAILED DESCRIPTION

Figure 2B:
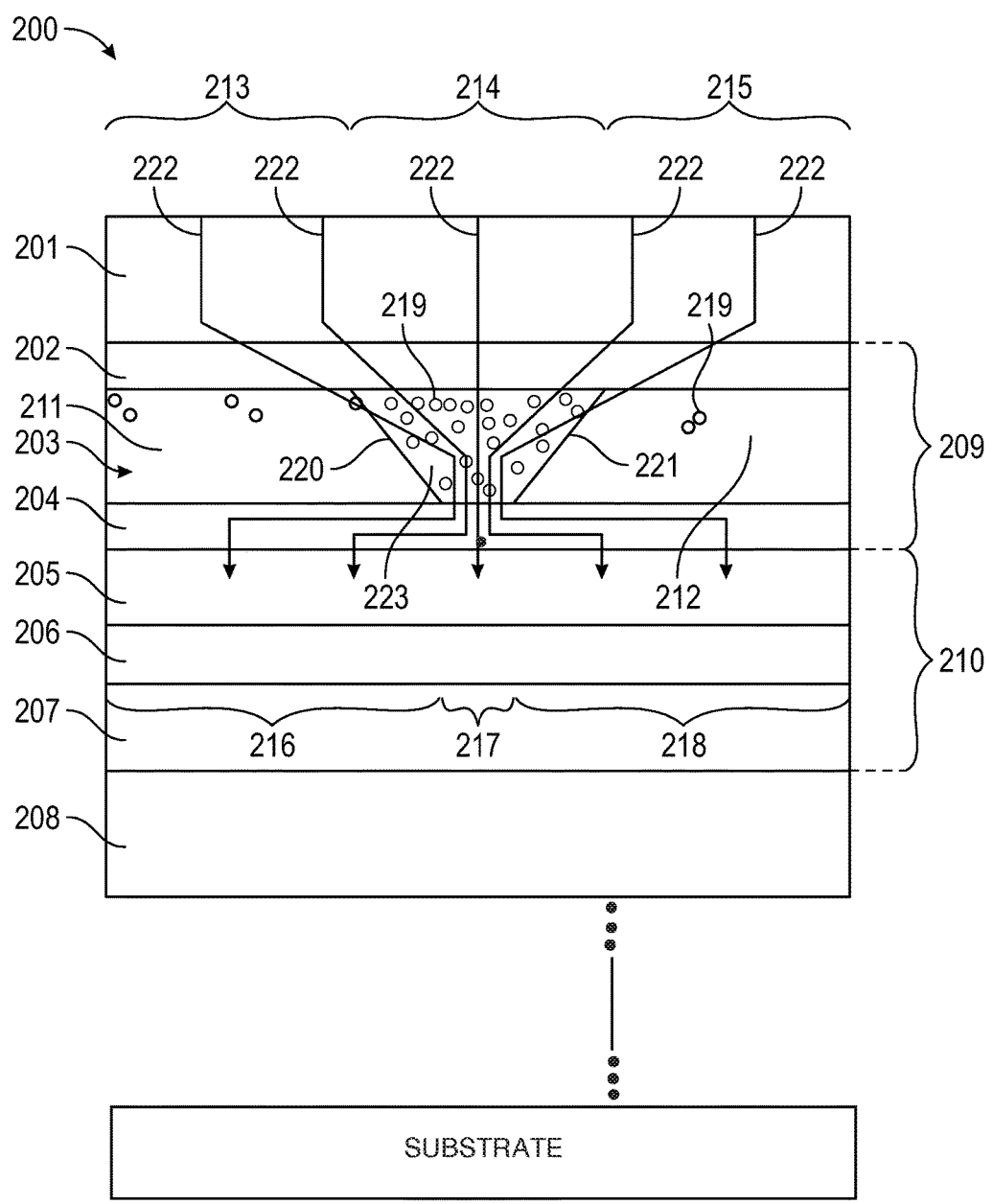

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

As described above, STTM has low power consumption and good scalability over conventional MRAM. However, an aggressively scaled STTM can have issues regarding the amount of current the STTM needs to switch from one memory state to another memory state. For example, the transistor in a memory cell (e.g., a cell having a one transistor and one resistor) controls the amount of current available to switch the cell. If the current is not sufficient the cell will not switch memory states. An aggressively scaled transistor may have difficulty supplying this necessary switching current. Therefore, Applicant has discovered this problem and determined how to utilize low switching current (i.e., low current density (Jc)) that is still able to switch memory states of an aggressively scaled STTM.

A low Jc is feasible with STTMs. Applicant has determined STTMs switch through a cooperative process in which all magnetic elements in the thin film (e.g., free layer of a MTJ) switch simultaneously from one magnetic state to the other, changing the resistance of the memory cell in the process. If sufficient current passes through the cell, the cell will switch, but below the Jc the cell remains in its original state As Applicant noted in U.S. Patent Application Publication No. 2014/0167191, the use of small contacts allows for a local Jc to pass in the STTM directly below the contact. Since it is a cooperative process, the magnetization direction directly under the contact forces the rest of the STTM to the new state, thus overcoming the issue of insufficient current.

More specifically, a current density in the order of 1-3 M amps/$cm^2$ may be required in some embodiments to switch the magnetic direction in the free layer of an MTJ device.

The total current can be reduced by reducing the size of the free layer. Also, the free layer can be switched even though the required current density occurs only in a portion of the layer. FIGS. 1B and 1C illustrate a contact to the free layer in an MTJ device. The contact of FIG. 1C is narrower than the contact of FIG. 1B. The graph of FIG. 1A demonstrates the normalized total current needed to switch the state of the free layer as a function of contact width. As illustrated, the current needed to switch the direction to the device can be reduced by using a narrower contact.

Figure 3:
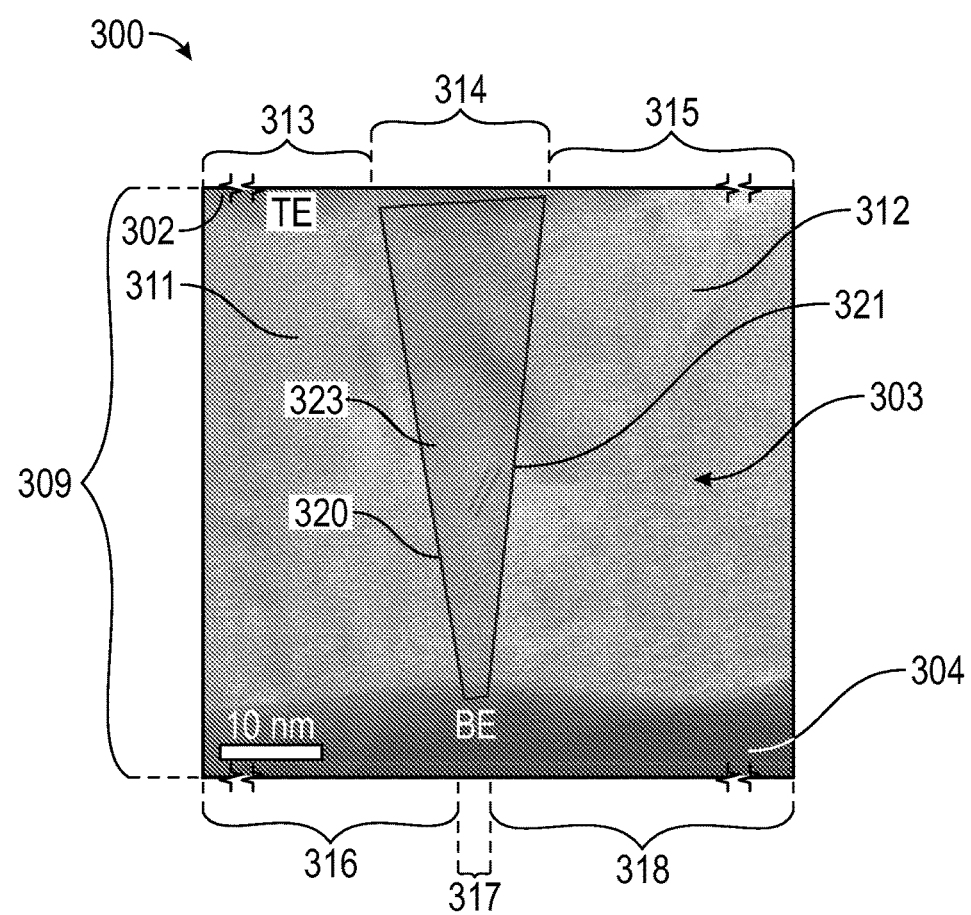
FIG. 3 includes a filament electrode in an embodiment of the invention.

As shown in FIGS. 2A-B and 3, embodiments described herein address how to form small contacts on STTMs that deliver highly concentrated current that surpasses Jc for a portion of the free layer, which in turn causes other portions of the free layer (not contacted by the contact) to flip memory states. More specifically, embodiments described herein address how resistive random access memory (RRAM) elements can be used to provide the above mentioned concentrated Jc.

RRAM relies on a class of materials that switch in a one-time event from a virgin insulating state to a low resistive state by way of a "forming" event. In the forming event, the device goes through "soft breakdown" in which a localized filament forms in the dielectric. This filament shunts current through the filament to form a low resistance state. FIG. 3 illustrates a trapezoidal filament 323 with a minor base width 317 of, for example, less than 5 nm and a major base 314 ranging between, for example, 5 to 20 nm. Walls 320, 321 slant inwards as they move towards layer 304 of stack 300 (inert electrode layer 304) and away from layer 302 (active electrode layer 302). This concentrates current (see 222 of FIG. 2B) of the "filament electrode" as the current goes towards portion 317.

With conventional RRAM, the RRAM switches from a low to a high resistive state and from a high to a low resistive state by applying voltages of different polarities to switch the state. Thus, conventional RRAM can serve as a memory. However, there are materials that switch permanently to the low resistance state or require voltages that are beyond the voltage range of the power supply (to which they couple) to switch into the high resistance range. For example, filaments for embodiments may include examples of such materials such as Copper (Cu), Hafnium (Hf), Titanium (Ti), Ruthenium (Ru), Aluminum (Al), and/or Silver (Ag). Filaments made from these materials may be embedded in a dielectric (e.g., $SiO_2$) layer 303. Thus, a filament formed from such a material can serve as a "programmable fuse" that shunts current towards small base 317 where the current concentrates and can act to flip the entire polarity of a free layer coupled to minor base 317 and metal layer 304. FIGS. 2A-B are now discussed to illustrate the concept.

FIG. 2a includes a stack 200 with electrodes 201, 208 and magnetic tunnel junction (MTJ) 210 including free layer 205, dielectric 206, and fixed layer 207. Between MTJ 210 and electrode 201 is "filament electrode" layer 209 (see also 309 of FIG. 3). Electrode layer is deemed an electrode "layer" as it is a layer whose filament has not yet been through the RRAM "forming" stage. Thus, as used herein an electrode layer may include a filament or be configured to include a filament upon a forming event (where configured to may indicate its dielectric layer positioned between metal source and barrier layers). Electrode layer 209 includes metal layer 202, dielectric layer 203, and metal layer 204. Metal layer 202 may be considered a "metal source" having an active metal such as Cu, Hf, Ti, Ru, Al, and/or Ag. Metal layer 204 may be considered a "metal barrier" having an inert metal such as Tantalum (Ta), Platinum (Pt), and Palladium (Pd). The programmable fuse 209 sits immediately above the free layer 205 of the STTM cell.

In an embodiment first metal layer 202 includes at least one of Cu, Hf, Ti, Ru, Al, and/or Ag, second metal layer 204 includes at least one of Ta, Pt, and Pd, and dielectric layer 203 includes at least one of Silicon, Oxygen, ($SiO_2$) and/or some other non-conducting dielectric or oxide. In an embodiment dielectric layer 206 includes magnesium (Mg) and oxygen (O) (e.g., $MgO_2$), and the fixed and free layers 207, 205 each include Cobalt (Co), Iron (Fe), and Boron (B) (e.g., CoFeB combinations such as $Co_{20}Fe_{60}B_{20}$).

In FIG. 2B, upon application of a "forming voltage" the dielectric 203 breaks down and forms a filament 223 (with sidewalls 220, 221) that extends to the top of the STTM cell 210 creating a very narrow conduction path that localizes the current flowing into the STTM. The filament forms within the dielectric (e.g., oxide) layer 203 and the source of the metal to form the metallic filament 223 is the source electrode (e.g., layer 202 in FIG. 2a) 202. It is this localization that causes the local current density Jc immediately above the STTM free layer 205 to increase greatly, thus switching locally and driving the rest of the free layer 205 to switch.

Thus, FIGS. 2A-B disclose an embodiment comprising: first and second electrodes 201, 202 on a substrate (not shown) and a perpendicular pMTJ 210. Memory cell 210 may be a MTJ or a pMTJ. A perpendicular STTM uses a pMTJ as a memory element. The material stack 200 may be fabricated with greater complexity (i.e., not every layer is shown in order to provide clarity with the figures without adding unnecessary detail known to those of ordinary skill in the art). For example, an anti-ferromagnetic layer may also be included between bottom electrode 208 and fixed magnetic layer 207. Additionally, electrodes 201, 208 may themselves include multiple layers of materials with differing properties. The material stack 200 may, in its most basic form, be an in-plane system, where spins of the magnetic layers are in a same plane as the layers themselves (i.e., function as a MTJ and not a pMTJ).

However, with layer or interface engineering the material stack may be fabricated to provide a perpendicular spin system. In an example, free magnetic layer (e.g., a free magnetic layer composed of CoFeB) 205 is thinned down from a conventional thickness used for in-plane STTM devices. The extent of thinning may be sufficient such that a perpendicular component obtained from the iron/cobalt (Fe/Co) in the free magnetic layer 205 interacting with oxygen in the dielectric layer 206 (e.g., interacting with a magnesium oxide (MgO) layer) dominates over the in-plane component of the free CoFeB layer 205. This example provides a perpendicular system based on a single layer system of coupling to one interface of the free layer (i.e., the CoFeB—MgO interface). The degree of oxidation of surface iron/cobalt atoms (Fe/Co) in the CoFeB layer 205 by oxygen from the MgO layer 206 provides the strength (stability) of the free layer 205 to have perpendicular-dominated spin states. Thickness of the fixed magnetic layer 207 also determines magnetization direction in the same manner as in the thickness of a free magnetic layer. Other factors may also determine the direction of magnetization. For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

Again regarding FIGS. 2A-B, pMTJ 210 is between the first and second electrodes 201, 208 and comprises a dielectric layer 206 between a fixed layer 207 and a free layer 205. Stack 200 also includes a third electrode layer 209, between the pMTJ 210 and the first electrode 201. Layer 209 includes an additional dielectric layer 203 between first and second metal layers 202, 204. In an embodiment fixed layer 207 may include alternating layers of Co and Pt. In an embodiment, dielectric layer 203 directly contacts the first and second metal layers 202, 204.

In FIG. 2B, dielectric layer 203 includes a conduction path (filament 223) directly contacting the first and second metal layers 202, 204, and first and second non-conducting insulative portions 211, 212 directly contacting each of the first metal layer 202, the second metal layer 204, and the conduction path 223. Conduction path/fuse 223 interfaces the first metal layer 202 along a first interface having a first width 214 and interfaces the second metal layer 204 along a second interface having a second width 217 that is smaller than width 214. While FIG. 2B shows a trapezoidal path 223 other embodiments are not so limited and may include cross-section shapes that are, for example, hour glass (hyperboloid) or cylindrical in nature. Layer 203 interfaces the first metal layer 202 along a third interface having a third width (comprised of widths 213, 214, 215) (see also 313, 314, 315 of FIG. 3) and interfaces the second metal layer along a fourth interface having a fourth width (comprised of widths 216, 217, 218) (see also 316, 217, 318 of FIG. 3), and the width 214 is smaller than the third width and the width 217 is smaller than the fourth width. In an embodiment width 217 is no greater than 5 nm and width 214 is at least 5 nm.

In an embodiment, the second metal layer 204 directly contacts the pMTJ. In an embodiment, the second metal layer 204 directly contacts the free layer 205. In an embodiment the first metal layer 202 directly contacts the first electrode 201.

In an embodiment path 223 (see also 323 of FIG. 3) has a lower electrical resistance than portions 211, 212 (see also 311, 312 of FIG. 3) of the dielectric sublayer 203 (see also 303 of FIG. 3) on either side of the conduction path. In an embodiment the conduction path 223 includes oxygen vacancies 219 concentrated around one of the first and second metal layers (e.g., see greater concentration near interface at width 214 as opposed to the lesser concentration near the interface at width 217).

Embodiments described herein that provide concentrated current 222 to satisfy a Jc threshold provide advantages over other solutions to reducing switching current such as reducing the perpendicular anisotropy/strength of the free layer (which also reduces the stability of the memory cell thereby reducing its memory state retention and making the memory more volatile). Attempts to counter the reduction in stability include decreasing the damping of the free layer (which is independent of the stability) so that the cell switches at lower current densities. However, doing so can limit the materials used in the fixed and free layers and may preclude, for example, a desirable free layer/dielectric layer/fixed layer such as a CoFeB/MgO/CoFeB system (i.e., there are undesirable materials limitations that effectively limit the amount of damping that can be provided with commercially viable memory cells). Furthermore, the ability to connect such a small contact (see width 217) of less than 5 nm is an advantage of an embodiment (which does not rely on lithography to create the concentrated fuse) considering such a small 5 nm width exceeds the limits of most commercially practical lithography (e.g., 22 CD). Another advantage of an embodiment is that the fuse/conduction path may be formed in electrode layer 209 at a semiconductor fabrication facility (fab) or at the locale of a customer that purchases memory cells after they have left the fab. The conduction path 223 may be identified as a location having less oxygen (i.e., having more oxygen vacancies) than the dielectric ($SiO_2$) in the layer 203 that the conduction path traverses (this is illustrated with element 219 in FIG. 2B). An embodiment enables aggressive scaling because transistors can be aggressively scaled if they are required to only provide Jc at a concentrated location instead of across a larger portion of the free layer.

In an embodiment, stack 200 may be located on a substrate, which may include Silicon (Si), SiGe, and the like. The substrate may include a semiconductor on insulator (SOI) substrate. The insulator may include $SiO_2$ or the like. In an embodiment the substrate has a height or thickness of 100 nm. "Thickness" or "height" as used herein is in the vertical direction of FIG. 2A, whereas "width" would be in the horizontal direction of FIG. 2A. Also, electrode 201 is on "top" of electrode 208.

In an embodiment of stack 200, layer 201 may be 3 to 30 nm thick, layer 202 may be 3 to 20 nm thick and include Cu, Hf, Ti, Ru, Al, and/or Ag (e.g., Cu, CuTe, CuGeTe, Ag, AgS, and/or Ag alloys), layer 203 may be 3 to 20 nm thick and include a nonconducting dielectric (e.g., SiOx, and/or AlOx), and layer 204 may be 3 to 20 nm thick and include Ta, Pt, and Pd (e.g., TiN, TiAlN, TaAlN, and/or TaN).

Various embodiments disclosed herein have addressed pMTJs and MTJs. Any such pMTJ or MTJ may be used in a memory cell by coupling one portion or node of the MTJ/pMTJ stack (e.g., top electrode 201 of FIG. 2B) to a bit-line and another node of the MTJ/pMTJ stack (e.g., bottom electrode 208 of FIG. 2B) to a source or drain node of a switching device, such as a selection transistor. The other of the source and drain node of the selection transistor may be coupled to a source line of the memory cell. The gate of the selection transistor may couple to a word-line. Such a memory cell may utilize TMR of the MTJ/pMTJ to store memory states. Embodiments provided herein provide a concentrated current to satisfy Jc while aggressively scaling transistors and the pMTJ cell. Such embodiments subsequently provide smaller and more power efficient memory cells that can be scaled below, for example, 22 nm CD. The STT memory cell may couple to a sense amplifier. A plurality of the STT memory bit cells may be operably connected to one another to form a memory array, wherein the memory array can be incorporated into a non-volatile memory device. It is to be understood that the selection transistor may be connected to the top electrode or the bottom electrode of a MTJ/pMTJ stack.

Figure 4:
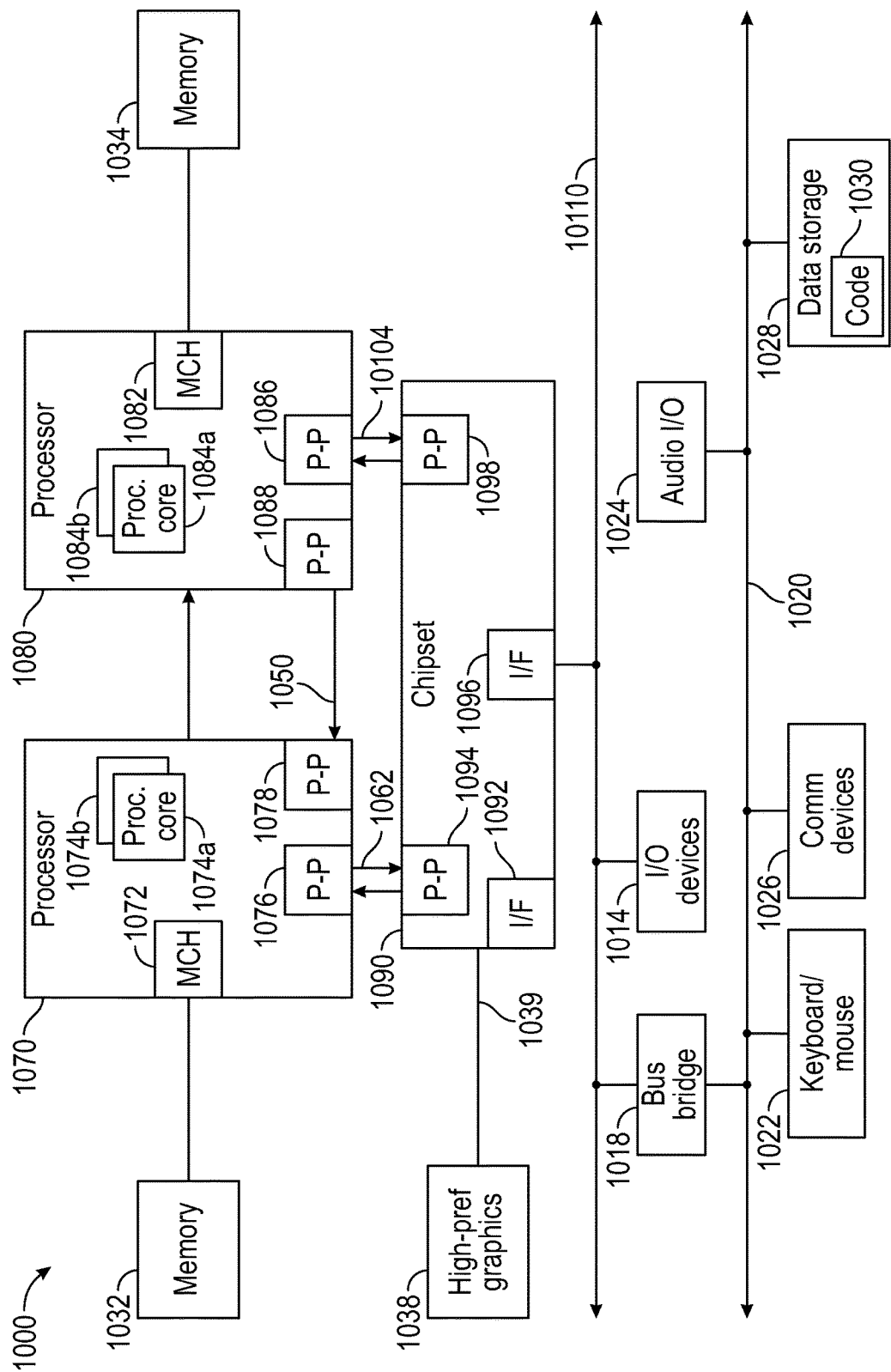
FIG. 4 includes a system comprising a memory cell within which an embodiment of the invention is included.

FIG. 4 includes a system that may include any of the above described embodiments. FIG. 4 includes a block diagram of a system embodiment 1000 in accordance with an embodiment of the present invention. System 1000 may include hundreds or thousands of the above described memory cells and be critical to memory functions in system 1000. System 1000 may be included in, for example, a mobile computing node such as a cellular phone, smartphone, tablet, Ultrabook®, notebook, laptop, personal digital assistant, and mobile processor based platform. The stability and power efficiency of such memory cells accumulates when the memory cells are deployed in mass and provides significant performance advantages (e.g., longer battery life, longer memory state storage in a broader range of operating temperatures) to such computing nodes.

Shown is a multiprocessor system 1000 that includes a first processing element 1070 and a second processing element 1080. While two processing elements 1070 and 1080 are shown, it is to be understood that an embodiment of system 1000 may also include only one such processing element. System 1000 is illustrated as a point-to-point interconnect system, wherein the first processing element 1070 and second processing element 1080 are coupled via a point-to-point interconnect 1050. It should be understood that any or all of the interconnects illustrated may be implemented as a multi-drop bus rather than point-to-point interconnect. As shown, each of processing elements 1070 and 1080 may be multicore processors, including first and second processor cores (i.e., processor cores 1074a and 1074b and processor cores 1084a and 1084b). Such cores 1074, 1074b, 1084a, 1084b may be configured to execute instruction code.

Each processing element 1070, 1080 may include at least one shared cache or memory unit which may include pMTJs and/ or MTJs described herein. The shared cache may store data (e.g., instructions) that are utilized by one or more components of the processor, such as the cores 1074a, 1074b and 1084a, 1084b, respectively. For example, the shared cache may locally cache data stored in a memory 1032, 1034 for faster access by components of the processor. In one or more embodiments, the shared cache may include one or more mid-level caches, such as level 2 (L2), level 3 (L3), level 4 (L4), or other levels of cache, a last level cache (LLC), and/or combinations thereof.

While shown with only two processing elements 1070, 1080, it is to be understood that the scope of the present invention is not so limited. In other embodiments, one or more additional processing elements may be present in a given processor. Alternatively, one or more of processing elements 1070, 1080 may be an element other than a processor, such as an accelerator or a field programmable gate array. For example, additional processing element(s) may include additional processors(s) that are the same as a first processor 1070, additional processor(s) that are heterogeneous or asymmetric to first processor 1070, accelerators (such as, e.g., graphics accelerators or digital signal processing (DSP) units), field programmable gate arrays, or any other processing element. There can be a variety of differences between the processing elements 1070, 1080 in terms of a spectrum of metrics of merit including architectural, microarchitectural, thermal, power consumption characteristics, and the like. These differences may effectively manifest themselves as asymmetry and heterogeneity amongst the processing elements 1070, 1080. For at least one embodiment, the various processing elements 1070, 1080 may reside in the same die package.

First processing element 1070 may further include memory controller logic (MC) 1072 and point-to-point (P-P) interfaces 1076 and 1078. Similarly, second processing element 1080 may include a MC 1082 and P-P interfaces 1086 and 1088. MC's 1072 and 1082 couple the processors to respective memories, namely a memory 1032 and a memory 1034, which may be portions of main memory locally attached to the respective processors. Memory 1032, 1024 may include MTJs/pMTJs described herein. While MC logic 1072 and 1082 is illustrated as integrated into the processing elements 1070, 1080, for alternative embodiments the MC logic may be discreet logic outside the processing elements 1070, 1080 rather than integrated therein.

First processing element 1070 and second processing element 1080 may be coupled to an I/O subsystem 1090 via P-P interfaces 1076, 1086 via P-P interconnects 1062, 10104, respectively. As shown, I/O subsystem 1090 includes P-P interfaces 1094 and 1098. Furthermore, I/O subsystem 1090 includes an interface 1092 to couple I/O subsystem 1090 with a high performance graphics engine 1038. In one embodiment, a bus may be used to couple graphics engine 1038 to I/O subsystem 1090. Alternately, a point-to-point interconnect 1039 may couple these components.

In turn, I/O subsystem 1090 may be coupled to a first bus 10110 via an interface 1096. In one embodiment, first bus 10110 may be a Peripheral Component Interconnect (PCI) bus, or a bus such as a PCI Express bus or another third generation I/O interconnect bus, although the scope of the present invention is not so limited.

As shown, various I/O devices 1014, 1024 may be coupled to first bus 10110, along with a bus bridge 1018 which may couple first bus 10110 to a second bus 1020. In one embodiment, second bus 1020 may be a low pin count (LPC) bus. Various devices may be coupled to second bus 1020 including, for example, a keyboard/mouse 1022, communication device(s) 1026 (which may in turn be in communication with a computer network), and a data storage unit 1028 such as a disk drive or other mass storage device which may include code 1030, in one embodiment. The code 1030 may include instructions for performing embodiments of one or more of the methods described above. Further, an audio I/O 1024 may be coupled to second bus 1020.

Note that other embodiments are contemplated. For example, instead of the point-to-point architecture shown, a system may implement a multi-drop bus or another such communication topology. Also, the elements of FIG. 4 may alternatively be partitioned using more or fewer integrated chips than shown in the FIG. 4. For example, a field programmable gate array may share a single wafer with a processor element and memory including MTJs described herein.

As used herein, a "free" magnetic layer is a magnetic layer storing a computational variable. A "fixed" magnetic layer is a magnetic layer with fixed magnetization (magnetically harder than the free magnetic layer). A tunneling barrier, such as a tunneling dielectric (e.g., MgO) or tunneling oxide, is one located between free and fixed magnetic layers. A fixed magnetic layer may be patterned to create inputs and outputs to an associated circuit. Magnetization may be written by spin transfer torque effect while passing a current through the input electrodes. Magnetization may be read via the TMR effect while applying voltage to the output electrodes. In an embodiment, the role of the dielectric layer (e.g., dielectric layers 105, 107) is to cause a large magneto-resistance ratio. The magneto-resistance is the ratio of the difference between resistances when the two ferromagnetic layers have AP magnetizations and the resistance of the state with the parallel magnetizations.

MTJs described herein, such as pMTJs, function essentially as a resistor, where the resistance of an electrical path through the MTJ may exist in two resistive states, either "high" or "low," depending on the direction or orientation of magnetization in the free magnetic layer(s) (embodiments may have one or more free layers) and in the fixed magnetic layers. In the case that the spin direction is down (minority) in the free magnetic layer, a high resistive state exists, wherein direction of magnetization in the coupled free magnetic layer(s) and the dominant (i.e., most stable) fixed magnetic layer are substantially opposed or AP with one another. In the case that the spin direction is up (majority) in the coupled free magnetic layer(s), a low resistive state exists, wherein the direction of magnetization in the coupled free magnetic layer(s) and the dominant fixed magnetic layer (e.g., thickest Pt layer or more number Pt layers) is substantially aligned or P with one another. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

The direction of magnetization in the coupled free magnetic layers may be switched through STT using a spin-polarized current. An electrical current is generally non-polarized (e.g. consisting of about 50% spin-up and about 50% spin-down electrons). A spin polarized current is one with a greater number of electrons of either spin-up or spin-down, which may be generated by passing a current through the fixed magnetic layers. The electrons of the spin polarized current from the fixed magnetic layers tunnel through the tunneling barrier or dielectric layers and transfers its spin angular momentum to the free magnetic layer, wherein the free magnetic layer will orient its magnetic direction from AP to that of the dominant fixed magnetic layer or P. The free magnetic layer may be returned to its original orientation by reversing the current.

Thus, the pMTJ may store a single bit of information ("0" or "1") by its state of magnetization. The information stored in the MTJ is sensed by driving a current through the pMTJ. The free magnetic layer(s) does not require power to retain its magnetic orientations. As such, the state of the MTJ is preserved when power to the device is removed. Therefore, a STT memory bit cell composed of stack 100, is, in an embodiment, non-volatile.

Various embodiments addressed herein include a semiconductive substrate. Such a substrate may be a bulk semiconductive material this is part of a wafer. In an embodiment, the semiconductive substrate is a bulk semiconductive material as part of a chip that has been singulated from a wafer. In an embodiment, the semiconductive substrate is a semiconductive material that is formed above an insulator such as a semiconductor on insulator (SOI) substrate. In an embodiment, the semiconductive substrate is a prominent structure such as a fin that extends above a bulk semiconductive material.

The following examples pertain to further embodiments.

Example 1 includes an apparatus comprising: first and second electrodes on a substrate; a perpendicular magnetic tunnel junction (pMTJ), between the first and second electrodes, comprising a dielectric layer between a fixed layer and a free layer; and a third electrode layer, between the pMTJ and the first electrode, including an additional dielectric layer between first and second metal layers; wherein first metal layer includes at least one of Copper (Cu), Hafnium (Hf), Titanium (Ti), Ruthenium (Ru) and Aluminum, the second metal layer includes at least one of Tantalum (Ta), Platinum (Pt), Palladium (Pd), and the additional dielectric layer includes at least one of Silicon, Oxygen, Copper (Cu), Hafnium (Hf), Titanium (Ti), Ruthenium (Ru) and Aluminum.

Another version of Example 1 includes an apparatus comprising: first and second electrodes on a substrate; a perpendicular magnetic tunnel junction (pMTJ), between the first and second electrodes, comprising a dielectric layer between a fixed layer and a free layer; and a third electrode layer, between the pMTJ and the first electrode, including an additional dielectric layer between first and second metal layers; wherein first metal layer includes a first metal comprising at least one of Copper (Cu), Hafnium (Hf), Titanium (Ti), Ruthenium (Ru), Aluminum, and Silver (Ag), the second metal layer includes a second metal including at least one of Tantalum (Ta), Platinum (Pt), Palladium (Pd) and Ti, and the additional dielectric layer includes a dielectric and the first metal.

Another version of Example 1 includes an apparatus comprising: first and second electrodes on a substrate; a perpendicular magnetic tunnel junction (pMTJ), between the first and second electrodes, comprising a dielectric layer between a fixed layer and a free layer; and a third electrode layer, between the pMTJ and the first electrode, including an additional dielectric layer between first and second metal layers; wherein first metal layer includes a first metal comprising at least one of Copper (Cu), Hafnium (Hf), Titanium (Ti), Ruthenium (Ru), Aluminum, and Silver (Ag), the second metal layer includes a second metal including at least one of Tungsten (W), Hafnium (Hf), Tantalum (Ta), Platinum (Pt), Palladium (Pd) and Ti, and the additional dielectric layer includes a dielectric and the first metal.

In example 2 the subject matter of the Example 1 can optionally include wherein the additional dielectric layer directly contacts the first and second metal layers.

In example 3 the subject matter of the Examples 1-2 can optionally include wherein the dielectric layer includes include magnesium (Mg) and oxygen (O), the fixed layer includes at least one of Cobalt (Co), Iron (Fe), Boron (B), Palladium (Pd), Platinum (Pt), Nickel (Ni), and a Heusler alloy, and the free layer includes at least one of Co, Fe, B, Pd, Pt, Ni, and a Heusler alloy.

A Heusler alloy is a ferromagnetic metal alloy based on a Heusler phase. Heusler phases are intermetallics with particular composition and face-centered cubic crystal structure. They are ferromagnetic as a result of the double-exchange mechanism between neighboring magnetic ions. In an embodiment the latter are manganese ions, which sit at the body centers of the cubic structure and carry most of the magnetic moment of the alloy.

In example 4 the subject matter of the Examples 1-3 can optionally include wherein the additional dielectric layer includes (a) a conduction path directly contacting the first and second metal layers, and (b) first and second non-conducting insulative portions directly contacting each of the first metal layer, the second metal layer, and the conduction path.

In example 5 the subject matter of the Examples 1-4 can optionally include wherein (a) the conduction path interfaces the first metal layer along a first interface having a first width and interfaces the second metal layer along a second interface having a second width, and (b) the second width is smaller than the first width.

In example 6 the subject matter of the Examples 1-5 can optionally include wherein (a) the additional dielectric layer interfaces the first metal layer along a third interface having a third width and interfaces the second metal layer along a fourth interface having a fourth width, and (b) the first width is smaller than the third width and the second width is smaller than the fourth width.

In example 7 the subject matter of the Examples 1-6 can optionally include wherein a cross-section, taken in a plane orthogonal to an additional plane in which the substrate is formed, of the conduction path is trapezoidal.

In example 8 the subject matter of the Examples 1-7 can optionally include wherein the second metal layer directly contacts the pMTJ.

In example 9 the subject matter of the Examples 1-8 can optionally include wherein the first metal layer directly contacts the first electrode.

In example 10 the subject matter of the Examples 1-9 can optionally include wherein the second width is no greater than 5 nm.

In example 11 the subject matter of the Examples 1-10 can optionally include wherein the second metal layer directly contacts the free layer.

In example 12 the subject matter of the Examples 1-11 can optionally include wherein the conduction path has a lower electrical resistance than portions of the dielectric sublayer on either side of the conduction path.

In example 13 the subject matter of the Examples 1-12 can optionally include wherein the conduction path includes oxygen vacancies concentrated around one of the first and second metal layers at a first concentration level and around another of the first and second metal layers at a second concentration level that is less than the first concentration level.

In example 14 the subject matter of the Examples 1-13 can optionally include wherein the conduction path (a) includes a filament contacting the free layer and the first electrode, and (b) conveys current from the first metal layer to the second metal layer via a path formed within insulative portions of the additional dielectric layer.

In example 15 the subject matter of the Examples 1-14 can optionally include a system comprising: a processor; a memory, coupled to the processor, including an apparatus according to any one of examples 1 to 14; and a communication module, coupled to the processor, to communicate with a computing node external to the system.

A communication module may include, for example, element 1026 of FIG. 4, a wireless radio interface, antennae, OFDM module, and the like.

In example 16 the subject matter of the Examples 1-14 can optionally include a mobile computing node including a non-volatile memory that comprises the pMTJ. Such a node may include Smartphone or wearable device included in the Internet of Things.

Example 17 includes an apparatus comprising: first and second electrodes on a substrate; a magnetic tunnel junction (MTJ), between the first and second electrodes, comprising a dielectric layer between a fixed layer and a free layer; and an additional dielectric layer directly contacting first and second metal layers; wherein (a) the first metal layer includes an active metal and the second metal includes an inert metal, and (b) the second metal layer directly contacts the free layer.

As shown in Example 17, embodiments may include an MTJ instead of or in addition to a pMTJ. For example, while FIG. 2a discusses element 210 as being a pMTJ element 210 could be an MTJ in other embodiments while still utilizing layer 209 for Jc purposes.

In example 18 the subject matter of the Example 17 can optionally include wherein the additional dielectric layer includes (a) a conduction path directly contacting the first and second metal layers, and (b) first and second non-conducting insulative portions directly contacting each of the first metal layer, the second metal layer, and the conduction path.

In example 19 the subject matter of the Examples 17-18 can optionally include wherein the first metal layer includes at least one of Copper (Cu), Hafnium (Hf), Titanium (Ti), Ruthenium (Ru) and Aluminum (Al), the second metal layer includes at least one of Tantalum (Ta), Platinum (Pt), and Palladium (Pd), and the additional dielectric layer includes at least one of Silicon, Oxygen, and Copper (Cu), Hafnium (Hf), Titanium (Ti), Ruthenium (Ru) and Aluminum (Al).

Another version of example 19 includes wherein first metal layer includes a first metal comprising at least one of Copper (Cu), Hafnium (Hf), Titanium (Ti), Ruthenium (Ru), Aluminum (Al), and Silver (Ag), the second metal layer includes at least one of Tantalum (Ta), Platinum (Pt), Palladium (Pd) and Ti, and the additional dielectric layer includes a nonconducting dielectric and the first metal.

In example 20 the subject matter of the Examples 17-19 can optionally include wherein (a) the conduction path interfaces the first metal layer along a first interface having a first width and interfaces the second metal layer along a second interface having a second width, and (b) the second width is smaller than the first width.

In example 21 the subject matter of the Examples 17-20 can optionally include wherein (a) the additional dielectric layer interfaces the first metal layer along a third interface having a third width and interfaces the second metal layer along a fourth interface having a fourth width, and (b) the first width is smaller than the third width and the second width is smaller than the fourth width.

In example 22 the subject matter of the Examples 17-21 can optionally include wherein first metal layer includes a first metal comprising at least one of Copper (Cu), Hafnium (Hf), Titanium (Ti), Ruthenium (Ru), Aluminum (Al), and Silver (Ag), the second metal layer includes a second metal having an atomic mass greater than 100 AMU, and the additional dielectric layer includes a nonconducting dielectric and the first metal.

In example 23 the subject matter of the Examples 17-22 can optionally include wherein the second metal layer includes a second metal having an atomic mass greater than 100 AMU and the additional dielectric layer includes a nonconducting dielectric and a metal that is also included in the first metal layer.

Example 24 includes an apparatus comprising: first and second electrodes on a substrate; a perpendicular magnetic tunnel junction (MTJ), between the first and second electrodes, comprising a dielectric layer between a fixed layer and a free layer; and an additional dielectric layer directly contacting first and second metal layers; wherein (a) the first metal layer includes an active metal and the second metal includes an inert metal, (b) the second metal layer directly contacts the free layer, and (c) the second metal has an atomic mass greater than 100 AMU.

In example 25 the subject matter of the Example 24 can optionally include wherein the additional dielectric layer includes (a) a conduction path directly contacting the first and second metal layers, and (b) first and second non-conducting insulative portions directly contacting each of the first metal layer, the second metal layer, and the conduction path.

Thus, an embodiment includes a second metal that has "high atomic mass". "High atomic mass", as used herein, includes an atomic mass greater than 100 AMU.

Also, there is no particular deposition order for embodiments. For example, the embodiment of FIG. 2a has layer 209 above layer 210, presumably indicating layer 209 is deposited after layer 210. However, in another embodiment deposition order may be reversed and layer 210 may be deposited after layer 209.

At times herein the conduction path has been referred to as a "fuse" but please note the conduction path may instead be thought of as an "anti-fuse." In other words, a fuse is conventionally considered a device that is initially in a conductive state and, after being "blown", finishes in an insulating phase. But embodiments of the "fuse" described herein include an RRAM device initially in an insulating phase and finishing in a conductive phase.

Also, embodiments exist that are not limited to serving as contacts for MTJs/pMTJs or even for a STTM device. For example, in addition to the delivering localized current to a STTM device other embodiments can be used to construct one time programmable connections in logic circuits. For example, this can be done by a customer of the chip (i.e., after the chip leaves the original fabrication (fab)) to configure the device "in the field" for specific usage modes. One particular use can be using the conduction path (e.g., path 223) in series with a selection device (e.g., a gate node of a thin film selector/transistor or diode).

An embodiment may be used in a programmable read-only memory (PROM) or field programmable read-only memory (FPROM) or one-time programmable non-volatile memory (OTP NVM). These are forms of digital memory where the setting of each bit is locked by a fuse or antifuse. They are a type of ROM (read-only memory) meaning the data in them is permanent and cannot be changed. PROMs are used in digital electronic devices to store permanent data such as firmware (microcode). Data may be written into a ROM during manufacture, while with a PROM the data is programmed into them after manufacture (in the field). PROMs may be used in microcontrollers, video game consoles, mobile phones, radio-frequency identification (RFID) tags, implantable medical devices, security keys, high-definition multimedia interfaces (HDMI) and in many other consumer and automotive electronics products. Embodiments may be used in a field-programmable gate array (FPGA) to form active interconnects between logic blocks and the like. Such a FPGA may be included on a system-on-chip (SoC) with a controller.

Example 26 includes an apparatus comprising: a resistive random access memory (RRAM) including a dielectric layer directly contacting first and second metal layers; wherein the second metal layer directly contacts a node of at least one of a switching device and an interconnect; wherein first metal layer includes a first metal comprising at least one of Copper (Cu), Hafnium (Hf), Titanium (Ti), Ruthenium (Ru), Aluminum, and Silver (Ag), the second metal layer includes a second metal including at least one of Tungsten (W), Hafnium (Hf), Tantalum (Ta), Platinum (Pt), Palladium (Pd) and Ti, and the dielectric layer includes a dielectric.

In example 27 the subject matter of Example 26 can optionally include wherein the node includes a gate node of a transistor and the dielectric layer includes the first metal.

Example 28 includes an apparatus comprising: a resistive random access memory (RRAM) including a dielectric layer directly contacting first and second metal layers; wherein the second metal layer directly contacts a node of at least one of a switching device and an interconnect; wherein the first metal layer includes an active metal and the second metal includes an inert metal.

In example 29 the subject matter of Example 28 can optionally include wherein the node includes a gate node of a transistor and the dielectric layer includes the first metal.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. An apparatus comprising:
   first and second electrodes on a substrate;
   a perpendicular magnetic tunnel junction (pMTJ), between the first and second electrodes, comprising a dielectric layer between a fixed layer and a free layer; and
   a third electrode layer, between the pMTJ and the first electrode, including an additional dielectric layer between first and second metal layers;
   wherein first metal layer includes a first metal comprising at least one of Copper (Cu), Hafnium (Hf), Titanium (Ti), Ruthenium (Ru), Aluminum, or Silver (Ag), the second metal layer includes a second metal including at least one of Tungsten (W), Hafnium (Hf), Tantalum (Ta), Platinum (Pt), Palladium (Pd) and Ti, and the additional dielectric layer includes a dielectric and the first metal.

2. The apparatus of claim 1, wherein the additional dielectric layer directly contacts the first and second metal layers.

3. The apparatus of claim 2, wherein the dielectric layer includes magnesium (Mg) and oxygen (O), the fixed layer includes at least one of Cobalt (Co), Iron (Fe), Boron (B), Palladium (Pd), Platinum (Pt), Nickel (Ni), or a Heusler alloy, and the free layer includes at least one of Co, Fe, B, Pd, Pt, Ni, or a Heusler alloy.

4. The apparatus of claim 2, wherein the additional dielectric layer includes (a) a conduction path directly contacting the first and second metal layers, and (b) first and second non-conducting insulative portions directly contacting each of the first metal layer, the second metal layer, and the conduction path.

5. The apparatus of claim 4, wherein (a) the conduction path interfaces the first metal layer along a first interface having a first width and interfaces the second metal layer along a second interface having a second width, and (b) the second width is smaller than the first width.

6. The apparatus of claim 5, wherein (a) the additional dielectric layer interfaces the first metal layer along a third interface having a third width and interfaces the second metal layer along a fourth interface having a fourth width, and (b) the first width is smaller than the third width and the second width is smaller than the fourth width.

7. The apparatus of claim 6, wherein a cross-section, taken in a plane orthogonal to an additional plane in which the substrate is formed, of the conduction path is trapezoidal.

8. The apparatus of claim 6, wherein the second metal layer directly contacts the pMTJ.

9. The apparatus of claim 8, wherein the first metal layer directly contacts the first electrode.

10. The apparatus of claim 8, wherein the second metal layer directly contacts the free layer.

11. The apparatus of claims 6, wherein the conduction path has a lower electrical resistance than portions of the additional dielectric layer on either side of the conduction path.

12. The apparatus of claims 6, wherein the conduction path includes oxygen vacancies concentrated around one of the first and second metal layers at a first concentration level and around another of the first and second metal layers at a second concentration level that is less than the first concentration level.

13. The apparatus of claims 6, wherein the conduction path (a) includes a filament contacting the free layer and the first electrode, and (b) conveys current from the first metal layer to the second metal layer via a path formed within insulative portions of the additional dielectric layer.

14. The apparatus of claim 5, wherein the second width is no greater than 5 nm.

15. A system comprising:
a processor;
a memory, coupled to the processor, including an apparatus according to claim 1; and
a communication module, coupled to the processor, to communicate with a computing node external to the system.

16. An apparatus comprising:
first and second electrodes on a substrate;
a magnetic tunnel junction (MTJ), between the first and second electrodes, comprising a dielectric layer between a fixed layer and a free layer; and
an additional dielectric layer directly contacting first and second metal layers;
wherein (a) the first metal layer includes an active metal and the second metal layer includes an inert metal, and (b) the second metal layer directly contacts the free layer.

17. The apparatus of claim 16, wherein the additional dielectric layer includes (a) a conduction path directly contacting the first and second metal layers, and (b) first and second non-conducting insulative portions directly contacting each of the first metal layer, the second metal layer, and the conduction path.

18. The apparatus of claim 17, wherein the first metal layer includes a first metal comprising at least one of Copper (Cu), Hafnium (Hf), Titanium (Ti), Ruthenium (Ru), Aluminum (Al), or Silver (Ag), the second metal layer includes at least one of Tungsten (W), Hafnium (Hf), Tantalum (Ta), Platinum (Pt), Palladium (Pd) or Ti, and the additional dielectric layer includes a nonconducting dielectric and the first metal.

19. The apparatus of claim 17, wherein the first metal layer includes a first metal comprising at least one of Copper (Cu), Hafnium (Hf), Titanium (Ti), Ruthenium (Ru), Aluminum (Al), or Silver (Ag), the second metal layer includes a second metal having an atomic mass greater than 100 AMU, and the additional dielectric layer includes a nonconducting dielectric and the first metal.

20. The apparatus of claim 17, wherein the second metal layer includes a second metal having an atomic mass greater than 100 AMU and the additional dielectric layer includes a nonconducting dielectric and a metal that is also included in the first metal layer.

21. The apparatus of claim 17, wherein (a) the conduction path interfaces the first metal layer along a first interface having a first width and interfaces the second metal layer along a second interface having a second width, and (b) the second width is smaller than the first width.

22. The apparatus of claim 21, wherein (a) the additional dielectric layer interfaces the first metal layer along a third interface having a third width and interfaces the second metal layer along a fourth interface having a fourth width, and (b) the first width is smaller than the third width and the second width is smaller than the fourth width.

23. An apparatus comprising:
first and second electrodes on a substrate;
a perpendicular magnetic tunnel junction (MTJ), between the first and second electrodes, comprising a dielectric layer between a fixed layer and a free layer; and
an additional dielectric layer directly contacting first and second metal layers;
wherein (a) the first metal layer includes an active metal and the second metal layer includes an inert metal, (b) the second metal layer directly contacts the free layer, and (c) the inert metal has an atomic mass greater than 100 AMU.

24. The apparatus of claim 23, wherein the additional dielectric layer includes (a) a conduction path directly contacting the first and second metal layers, and (b) first and second non-conducting insulative portions directly contacting each of the first metal layer, the second metal layer, and the conduction path.

25. An apparatus comprising:
a resistive random access memory (RRAM) including a dielectric layer directly contacting first and second metal layers;
wherein the second metal layer directly contacts a node of at least one of a switching device or an interconnect;
wherein first metal layer includes a first metal comprising at least one of Copper (Cu), Hafnium (Hf), Titanium (Ti), Ruthenium (Ru), Aluminum, or Silver (Ag), the second metal layer includes a second metal including at least one of Tungsten (W), Hafnium (Hf), Tantalum (Ta), Platinum (Pt), Palladium (Pd) or Ti, and the dielectric layer includes a dielectric;
wherein the dielectic layer includes the first metal.

26. The apparatus of claim 25, wherein the node includes a gate node of a transistor.

* * * * *

UNITED STATES PATENT AND TRADEMARK OFFICE
CERTIFICATE OF CORRECTION

PATENT NO. : 10,340,443 B2  
APPLICATION NO. : 15/735613  
DATED : July 2, 2019  
INVENTOR(S) : Brian S. Doyle et al.

Page 1 of 1

It is certified that error appears in the above-identified patent and that said Letters Patent is hereby corrected as shown below:

In the Claims

Column 14, Line 36, "(PD) and" should be --(PD) or--.

Signed and Sealed this
Tenth Day of December, 2019

Andrei Iancu
*Director of the United States Patent and Trademark Office*